(12) United States Patent
Chung

(10) Patent No.: US 7,271,653 B2
(45) Date of Patent: Sep. 18, 2007

(54) AMPLIFIER WITH A VOLTAGE-CONTROLLED QUIESCENT CURRENT AND OUTPUT CURRENT

(75) Inventor: Kyu-Young Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 100 days.

(21) Appl. No.: 11/178,899

(22) Filed: Jul. 11, 2005

(65) Prior Publication Data

US 2006/0012433 A1   Jan. 19, 2006

(30) Foreign Application Priority Data

Jul. 13, 2004   (KR) .................. 10-2004-0054494

(51) Int. Cl.
*H03F 3/45* (2006.01)

(52) U.S. Cl. ...................... 330/255; 330/267

(58) Field of Classification Search .............. 370/53, 370/55, 57, 61, 64, 67
See application file for complete search history.

(56) References Cited

U.S. PATENT DOCUMENTS

| | | | |
|---|---|---|---|
| 4,737,732 A | 4/1988 | Westwick | |
| 5,294,892 A | 3/1994 | Ryat | 330/253 |
| 5,311,145 A * | 5/1994 | Huijsing et al. | 330/255 |
| 5,623,229 A | 4/1997 | Murray | 330/255 |
| 6,384,683 B1 * | 5/2002 | Lin | 330/257 |
| 6,483,382 B1 | 11/2002 | Gerstenhaber | 330/252 |
| 6,714,076 B1 * | 3/2004 | Kalb | 330/255 |

FOREIGN PATENT DOCUMENTS

| | | |
|---|---|---|
| JP | 5-191162 | 7/1993 |
| KR | 1020010030408 A | 4/2001 |

OTHER PUBLICATIONS

Chang et al., "A Constant-gm Global Rail-to-Rail Operational Amplifier with Linear Relationship of Currents", pp. 93-100.

* cited by examiner

*Primary Examiner*—Henry Choe
(74) *Attorney, Agent, or Firm*—F. Chau & Assoc., LLC

(57) ABSTRACT

An amplifier capable of controlling the magnitudes of quiescent and output current, using externally supplied voltages. The amplifier includes: an input circuit converting a voltage difference between input signals into a current; an output circuit outputting an output current to the outside of the (class AB) amplifier (in response to a change in voltages at the first and second output nodes of the input circuit); a first control circuit generating a first bias current (when a first control voltage is applied), and a first control current; and a second control circuit generating a second bias current (whose magnitude is less than that of the first bias current) when a second control voltage is applied, and a second control current. In a first operating mode the first bias current controls the magnitude of quiescent flowing through the output circuit. The first control circuit and the output circuit form a current mirror. In a second operating mode, the first and second control circuits change the magnitudes of the first and second control currents so as to control the magnitude of the output current. The magnitudes of quiescent current and output current can be easily controlled, and the amplifier can operate stably regardless of external manufacturing process change since there are a few circuit parameter variations.

21 Claims, 3 Drawing Sheets

AMPLIFIER WITH A VOLTAGE-CONTROLLED QUIESCENT CURRENT AND OUTPUT CURRENT

BACKGROUND OF THE INVENTION

This application claims the priority under 35 USC § 119 to Korean Patent Application No. 2004-54494, filed on Jul. 13, 2004, in the Korean Intellectual Property Office, the disclosure of which is incorporated herein in its entirety by reference.

1. Field of the Invention

The present invention relates to an amplifier, and more particularly, to a (class AB) amplifier having easily controlled quiescent current during a static state of the class AB amplifier and easily controlled output current in its amplifying states.

2. Description of the Related Art

Push-pull amplifiers made up of CMOS transistors are extensively used in consumer goods, (e.g., mainly in acoustic amplifiers). Amplifiers are most generally categorized into analog amplifiers and digital amplifiers.

Class A amplifiers, class B amplifiers, and class AB amplifiers are analog amplifiers, while class D amplifiers are digital amplifiers. The performance of an acoustic amplifier is commonly measured by its linearity rather than by its (power) efficiency. Therefore, analog linear amplifiers are popular in the field of acoustic amplifiers, even though they are typically the most power efficient. In other words, a typical analog amplifier having excellent linearity has had poor (energy) efficiency.

Until now, when a class A amplifier, a class B amplifier, or a class AB amplifier with excellent linearity has been used a large-output acoustic amplifier, a large power loss has been unavoidable.

In particular, in the case of the class A amplifier, the rate of power loss is typically greater than a maximum rate of amplifier output power. In general, the efficiency rate of the class A amplifier is less than 25%. In class A amplifier, there is always some quiescent power (current) used for bias or reference circuitry that is not delivered to the load.

As an alternative to the class A analog amplifier, a class B push-pull amplifier in which two transistors are combined in the form of an emitter follower to minimize energy loss, has been introduced. However, although the class B push-pull amplifier has higher efficiency, crossover distortion occurs when a signal level is low.

Two transistors installed in the class B amplifier are alternately switched ON or OFF. When a small amount of current flows through the transistors, they are switched on/off at a high speed. However, when a lot of current flows through the transistors, it is difficult to switch them ON/OFF at a high speed. Since no bias current flows through the class B amplifier, the transistors are not switched on/off at a high speed in a region where significant currents flows, which aggravates the total harmonic distortion (THD).

In the case of the class AB amplifier, which is an intermediate type between the class A and B amplifiers, a certain amount of (quiescent) current flows through it even in a static state. The size of the current flowing through the class AB amplifier is far smaller than that of current flowing through the class A amplifier but is much larger than that of current flowing through the class B amplifier. Accordingly, the greater the amount of bias (quiescent) current flowing through the class AB amplifier, the more closely the characteristics of the particular class AB amplifier is to those of the class A amplifier. By contrast, the less the amount of bias (quiescent) current flowing through the class AB amplifier, the more closely the characteristics of a particular class AB amplifier is to those of the class B amplifier.

Accordingly, there is a growing need to control the operation of the class AB amplifier so that a desired amount of current can flow through it in both a static state and an operating state.

SUMMARY OF THE INVENTION

Embodiments of the invention provide a (class AB) analog amplifier in which the magnitudes of quiescent current and output current can be easily controlled by externally supplied voltages.

According to one aspect of the invention, there is provided a (class AB) amplifier comprising an input circuit configured to convert a voltage difference between input signals into a current (and configured to control voltages at a first output node and a second output node); an output circuit configured to outputt an output current (to a load) outside of the amplifier (in response to a change in the voltages at the first and second output nodes); a first control circuit generating a first bias current when a first control voltage is applied, and controlling the magnitude of a first control current, which flows along a first current path (between the first output node and the second output node) formed in the first control circuit, in response to the first bias current; and a second control circuit generating a second bias current (whose magnitude may be less than that of the first bias current) when a second control voltage is applied, and controlling the magnitude of a second control current, which flows along a second current path (between the first output node and the second output node) formed in the second control circuit(. The first and second control circuits control the magnitude of the quiescent current, which flows through the output circuit, in response to the first bias current in a first operating mode, and control the magnitude of the (sourcing or sinking) output current by changing the magnitudes of the first and second control currents in a second operating mode.

The input circuit may include a folded-cascode operational transconductance amplifier (OTA). The first control circuit together with the output circuit forms a current mirror, and the magnitude of the quiescent current (in the output circuit) is maintained in proportion to the magnitude of the first bias current (in the first control circuit).

The first operating mode is an operating mode where the voltages of the input signals are equal to each other and the quiescent current flows through the output circuit. The second operating mode is an amplifying mode where the voltages of the input signals are different from each other and the output current is generated by (sourced by) or supplied to (sinked into) the output circuit.

The first and second control voltages are applied from the outside of the class AB amplifier, and the magnitude of the first bias current is determined by the first control voltage, and the magnitude of the second bias current is determined by the second control voltage.

The output circuit comprises a pull-up transistor having a first end connected to a power supply voltage, a gate connected to the first output node, and a second end connected to a third output node; and a pull-down transistor having a first end connected to the third output node, a gate connected to the second output node, and a second end connected to a ground voltage.

The first control circuit comprises a first control transistor having a first end connected to the power supply voltage, a gate connected to first control voltage, and a second end connected to a first node; a second control transistor having a first end connected to the first node, a gate connected to the second output node, and a second end connected to the ground voltage; and a third control transistor having a first end connected to the first output node, a second end connected to the second output node, and a gate connected to the first node. The first bias current flows through (e.g., from) the first control transistor and through (e.g., to) the second control transistor.

The first control current flows through the third control transistor. The third control transistor may be an NFET (e.g., NMOS) transistor.

The second control circuit comprises a sixth control transistor having a first end connected to the power supply voltage, a gate connected to the first output node, and the second end connected to the second node; a fifth control transistor having a first end connected to the second node, a gate connected to the second control voltage, and a second end connected to the ground voltage; and a fourth control transistor having a first end connected to the first output node, a second end connected to the second output node, and a gate connected to the second node. The second bias current flows through (e.g., from) the sixth control transistor and through (e.g.g to) the fifth control transistor.

The second control current flows through the fourth control transistor. The fourth control transistor is a PFET (e.g., PMOS) transistor. The magnitude of the first bias current may be smaller than the magnitude of the second bias current.

According to another aspect of the invention, there is provided a class AB amplifier comprising a folded-cascode operational transconductance amplifier controlling voltages at a first output node and a second output node by converting a voltage difference between input signals into a current; an output circuit outputting an output current to the outside of the class AB amplifier in response to a change in the voltages at the first and second output nodes; a first control circuit forming a first current path between the first and second output nodes, and controlling the magnitude of current flowing along the first current path when a first control voltage is applied; and a second control circuit forming a second current path between the first and second output nodes, and controlling the magnitude of current flowing along the second current path when a second control voltage is applied. The first and second control circuits controls the magnitude of a quiescent current, which flows through the output circuit, using a first bias current generated in response to application of the first control voltage in a first operating mode, and controls the magnitude of the output current by adjusting the magnitudes of current flowing along the first and second current paths in a second operating mode.

BRIEF DESCRIPTION OF THE DRAWINGS

The above and other aspects and advantages of the invention will become more apparent by describing in detail exemplary embodiments thereof with reference to the attached drawings. In the accompanying drawings, the same reference numerals represent the same elements throughout the drawings, and.

DETAILED DESCRIPTION OF THE EXEMPLARY EMBODIMENTS

Figure 1:
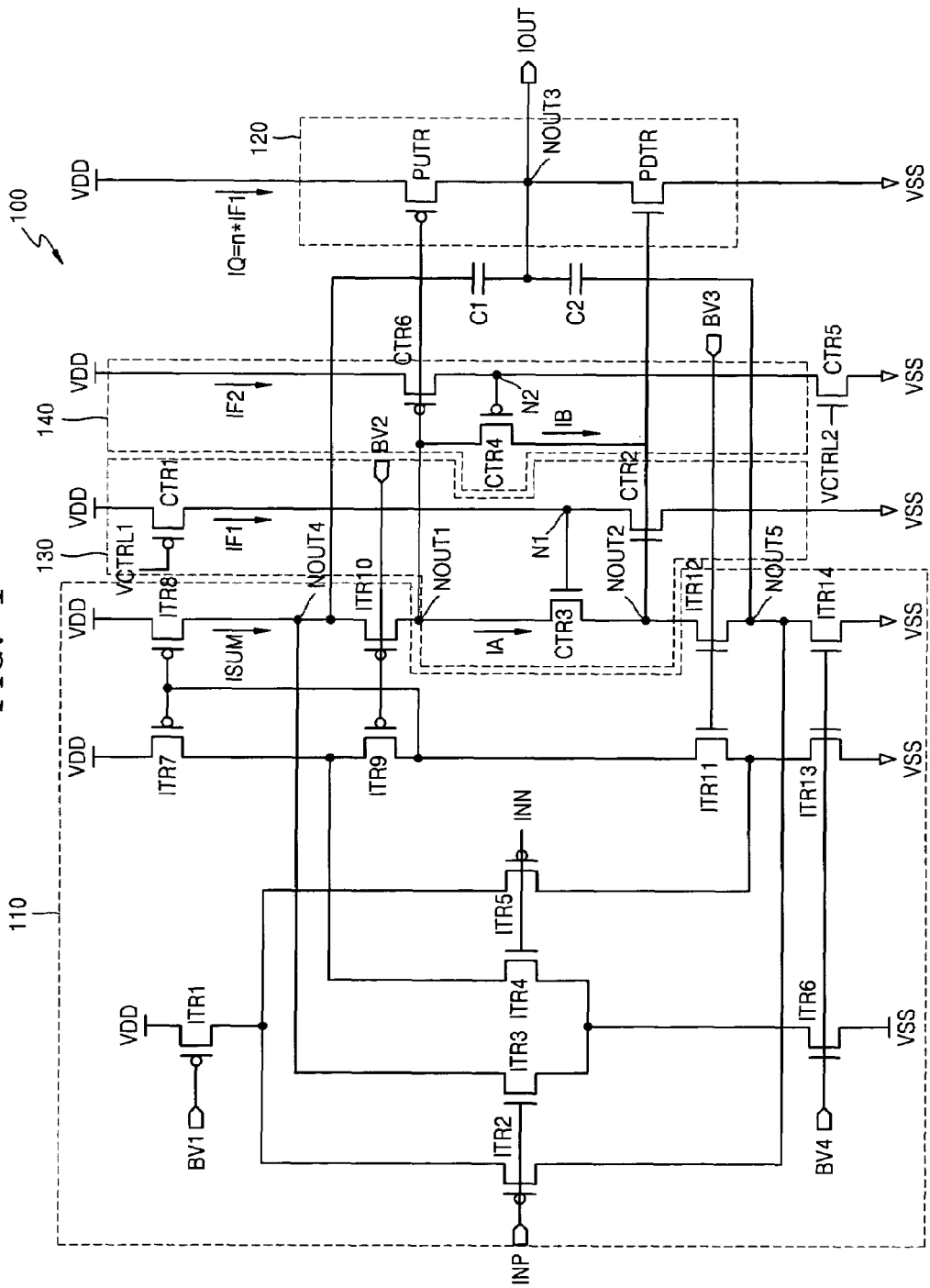
FIG. 1 is a circuit diagram illustrating the operation of an amplifier in a static (quiescent) state according to an embodiment of the invention.

FIG. 1 is a circuit diagram illustrating the operation of an amplifier 100 in a static (quiescent) state (a first mode of operation) according to an embodiment of the present invention. The amplifier 100 of FIG. 1 includes an input circuit 110, an output circuit 120, a first control circuit 130, and a second control circuit 140.

The input circuit 110 controls voltages at a first output node NOUT1 and a second output node NOUT2 by transforming the voltage difference between the input signals INP and INN. The output circuit 120 outputs (sources or sinks) an (amplified) output current IOUT to a load (not shown) outside of the amplifier 100 in response to a change in the voltages at the first and second output nodes NOUT1 and NOUT2.

When a first control voltage VCTRL1 is applied to the first control circuit 130, a first bias current IF1 is generated, and controls the magnitude of a first control current IA flowing along a first current path (formed in the first control circuit 130) flows in response to the generation of the first bias current IF1.

Here, the first current path (first control current IA) flows from the first output node NOUT1 to the second output node NOUT2, through a third control transistor CTR3 which will be described in detail below.

When a second control voltage VCTRL2 is applied to the second control circuit 140, a second bias current IF2 whose magnitude is less than that of the first bias current IF1 is generated, and controls the magnitude of a second control current IB flowing along a second current path (formed the second control circuit 140) in response to the generation of the second bias current IF2.

The second current path (second bias current IF2) ranges from the first output node NOUT1 to the second output node NOUT2, through a fourth control transistor CTR6 which will be described in detail below.

When the first bias current IF is supplied in a first operating (static, quiescent) mode, the first and second control circuits 130 and 140 control the amount (magnitude) of quiescent current IQ flowing through the output circuit 120. In a second operating mode (amplifying), the first and second control circuits 130 and 140 control the amount (magnitude) of the output current IOUT by adjusting the amounts (magnitudes) of the first and second control currents IA and IB.

The first operating mode is a static (quiescent) mode where voltages of the input signals INP and INN are equal to each other, thus causing the quiescent current IQ to flow through the (transistors PUTR and PDTR of the) output circuit 120. The second operating mode is an amplifying mode where the voltages of the input signals INP and INN are different from each other, thus causing the output current IOUT to be sourced by or sinked into the output circuit 120 (through a load not shown). The second (amplifying) operating mode includes two operating states: a first amplifying (current sourcing) state; and a second amplifying (current sinking) state.

The amplifier 100 includes a Folded-Cascode operational transconductance amplifier (OTA), which transforms a voltage difference between input signals (INP, INN) into a current, as the input circuit 110.

The input circuit 100 operates in response to four bias voltages BV1 through BV4. When the four bias voltages BV1 through BV4 are applied to the input circuit 110, the transistors (switches) ITR1, ITR9, ITR10, ITR11, ITR12, ITR6, ITR13, and ITR14 are turned ON to operate the input circuit 110.

When the voltage of the input signal INP is greater than that of the input signal INN, transistor ITR3 conducts a larger amount of current to the ground than transistor ITR4. As a result, the voltage at a fourth output node NOUT4 becomes lower than the voltage at the source of transistor (switch) ITR9. A change in the voltage at the fourth output node NOUT4 results in a change in the voltages at the first and second output nodes NOUT1 and NOUT2.

On the other hand, when the voltage of the input signal INP is smaller than that of the input signal INN, the transistor ITR3 conducts a smaller amount of current to the ground than the transistor ITR4. As a result, the voltage at the fourth output node NOUT4 becomes larger than the voltage at the source of transistor (switch) ITR9. A change in the voltage at the fourth output node NOUT4 changes the voltages at the first and second output nodes NOUT1 and NOUT2.

The output circuit 120 includes a pull-up transistor PUTR and a pull-down transistor PDTR. A power supply voltage VDD is applied to a first end of the pull-up transistor PUTR, and a second end thereof is connected to a third output node NOUT3, and the gate thereof is connected to the first output node NOUT1, respectively.

A first end of the pull-down transistor PDTR is likewise connected to the third output node NOUT3 and the gate thereof is connected to the second output node NOUT2, and the ground voltage VSS is applied to its second end.

The degrees to which the pull-up transistor PUTR and the pull-down transistor PDTR are turned ON are respectively controlled by the voltages applied at the first and second output nodes NOUT1 and NOUT2, respectively, so as to adjust the magnitude and sense (direction) of the output current IOUT (or the magnitude of quiescent current IQ).

The quiescent current IQ flows from the power supply voltage VDD to the ground voltage VSS when the voltages of the input signals INP and INN are equal to each other, thus making the amplifier 100 enter a first (static, quiescent) state.

The output current IOUT is sourced from the power supply voltage VDD of the output circuit 120 to a load (not shown) via the third output node NOUT3 or is sinked from a load (not shown) via the third output node NOUT3 to the ground voltage VSS when the voltages of the input signals INP and INN are different from each other, thus making the amplifier 100 enter a second operating (amplifying) mode. The magnitudes of the quiescent current IQ and of the output current IOUT are controlled by the first and second control circuits 130 and 140.

The first control circuit 130 includes first through third control transistors CTR1 through CTR3. The power supply voltage VDD is applied to a first end of the first control transistor CTR1, and the first control voltage VCTRL1 is applied to its gate, and its second end is connected to a first node N1. A first end of the second control transistor CTR2 is connected to the first node N1, and the ground voltage VSS is applied to its second end, while its gate is connected to the second output node NOUT2.

A first end and second end of the third control transistor CTR3 are connected to the first and second output nodes NOUT1 and NOUT2, respectively, and its gate is connected to the first node N1. The first bias current IF flows through the first control transistor CTR1 and through the second control transistor CTR2.

The first control current IA flows through the third control transistor CTR3. The third control transistor CTR3 is an NFET (e.g., NMOS) transistor.

The second control circuit 140 includes a fourth, fifth and sixth control transistors CTR4, CTR5 and CTR6. The power supply voltage VDD is applied to a first end of the sixth control transistor CTR6, and its second end is connected to the second node N2, while its gate is connected to the first output node NOUT1, respectively. A first end of the fifth control transistor CTR5 is likewise connected to the second node N2, and the ground voltage VSS is applied to its second end, while the second control voltage VCTRL2 is applied to its gate.

A first end and second end of the fourth control transistor CTR4 are connected to the first and second output nodes NOUT1 and NOUT2, respectively, and its gate is connected to the second node N2. The second bias current IF2 flows through the sixth control transistor CTR6 and through (to) the fifth control transistor CTR5.

The second control current IB flows through the fourth control transistor CTR4. The fourth control transistor CTR4 is a P-type field-effect (PFET, e.g., PMOS) transistor. The magnitude of first bias current IF1 may be smaller than that of second bias current IF2.

The operation of the amplifier 100 in the static (quiescent) state will now be described. In the static (quiescent) state, the voltages of the input signals INP and INN are equal to each other, thus making the quiescent current IQ flow through (the transistors PUTR and PDTR of) the output circuit 120. The first and second control circuits 130 and 140 control the magnitude of quiescent current IQ.

When the first control voltage VCTRL1 is applied to the first control circuit 130, the first control transistor CTR1 is turned ON causing the first bias current IF1 to flow through the first control transistor CTR1 and through the second control transistor CTR2, to ground VSS.

The first and second control transistors CTR1 and CTR2 and the pull-up transistor PUTR and the pull-down transistor PDTR (of the output circuit 120) form a current mirror. Therefore, if the size of the pull-down transistor PDTR is n times larger than that of the second control transistor CTR2, the magnitude of quiescent current IQ flowing through the output circuit 120 becomes n times more than that of first bias current IF1.

When the bias current BV4 is applied to the transistors ITR13 and ITR14, these transistors are turned ON, thus causing a current ISUM to flow through the transistor ITR8 of the input circuit 110. At the first output node NOUT1, the current ISUM is divided into the first control current IA (flowing along the first current path) and the second control current IB (flowing along the second current path).

When the second control voltage VCTRL2 is applied to the second control circuit 140, the fifth control transistor CTR5 is turned ON and the second bias current IF2 flows through the second control circuit 140. Application of the second control voltage VCTRL2 may make the magnitude of second bias current IF2 smaller than that of first bias current IF1.

When the magnitude of the second bias current IF2 is much less than that of the first bias current IF1, the second bias current IF2 hardly flows through the sixth and fifth control transistors CTR6 and CTR5 of the second control circuit 140. In this case, the voltage at the second node N2 becomes almost equal to that at the power supply voltage VDD. When the voltage at the second node N2 is almost the same as the power supply voltage VDD, the fourth control transistor CTR4 is almost turned OFF, and as a result, the magnitude of the second control current IB flowing along the second current path becomes zero (or approximately 0). Therefore, the magnitude of the first control current IA flowing along the first current path becomes almost equal to that of the current ISUM flowing through the transistor ITR8 of the input circuit 110.

As described above, during the static state of the amplifier 100, the magnitude of the quiescent current IQ is proportional to that of the first bias current IF1. Since the magnitude of the first bias current IF is controlled by the first control voltage VCTRL1, the quiescent current IQ is controlled by the first control voltage VCTRL1.

Figure 2:
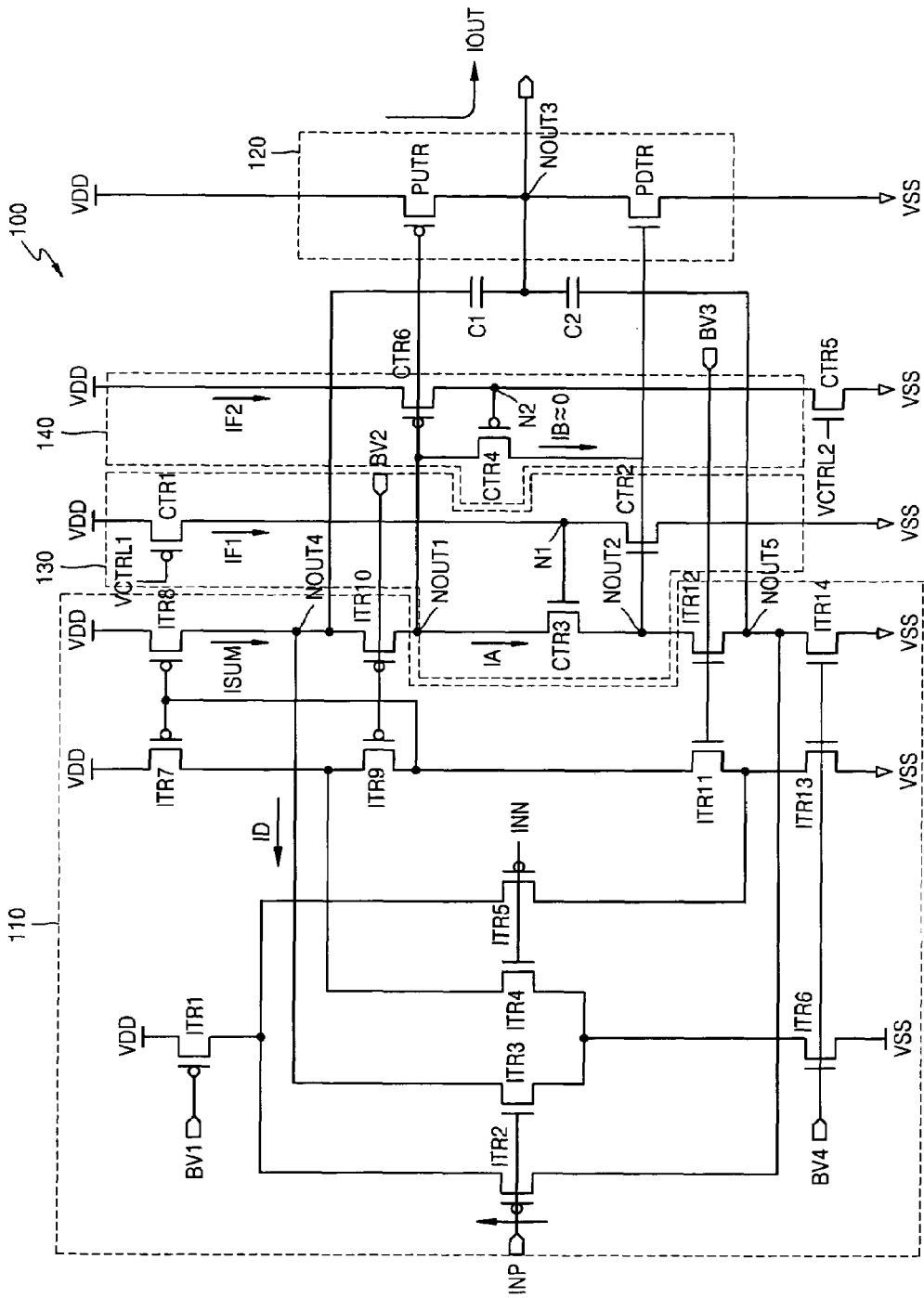
FIG. 2 is a circuit diagram illustrating the operation of the amplifier of FIG. 1 in a first amplifying (current sourcing) state.

FIG. 2 is a circuit diagram illustrating the operation of the amplifier 100 of FIG. 1 in a first amplifying (current sourcing) state. When the voltage of the input signal INP is greater than that of the input signal INN, the transistor ITR3 conducts a larger magnitude of current (ID) to the ground VSS than does the transistor ITR4. Generation of a current ID (through transistor ITR3) reduces the voltage at the fourth output node NOUT4 slightly.

Since the fourth control transistor CTR4 is almost turned OFF, the resistance generated through the first output node NOUT1 becomes very great. In this case, when the voltage at the fourth output node NOUT4 is slightly lowered, the voltage at the first output node NOUT1 is greatly reduced. Thus, the pull-up transistor PUTR is turned ON and the output current IOUT is output (sourced) from the power supply voltage VDD via the third output node NOUT3 (through a load not shown). In this amplifying state, a sourcing current is generated. If a capacitor (load, not shown) is connected to the third output node NOUT3, the capacitor will be charged.

Figure 3:
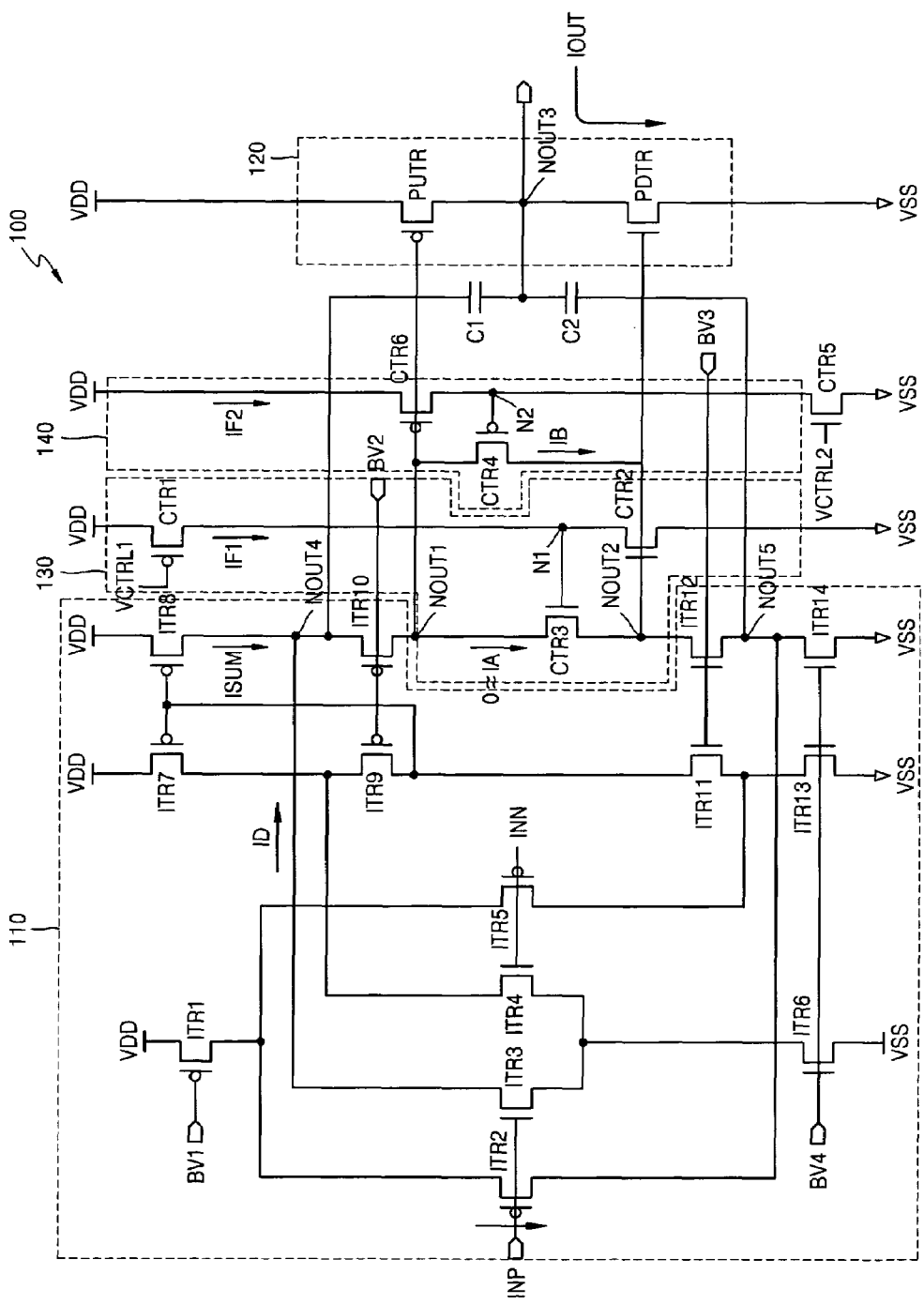
FIG. 3 is a circuit diagram illustrating the operation of the amplifier of FIG. 1 in a second amplifying (current sinking) state.

FIG. 3 is a circuit diagram illustrating the operation of the amplifier 100 of FIG. 1 in a second (current sinking) amplifying state. When the voltage of the input signal INP is smaller than that of the input signal INN, the transistor ITR3 conducts a smaller magnitude of current to the ground than the transistor ITR4. In this case, the current ID flows towards the fourth output node NOUT4, and the voltage of the fourth output node NOUT4 becomes slightly increased.

Also, since the fourth control transistor CTR4 is almost turned OFF, the value of resistance generated at the first output node NOUT1 becomes greatly increased. Therefore, when the voltage at the fourth output node NOUT4 is slightly increased, the voltage at the first output node NOUT1 is greatly increased. When the voltage at the first output node NOUT1 is greatly increased, the sixth control transistor CTR6 is turned OFF, and the voltage at the second node N2 is largely reduced in inverse proportion to that at the first output node NOUT1 that is largely increased due to large resistance generated at a drain of the sixth control transistor.

A reduction in the voltage at the second node N2 causes the fourth control transistor CTR4 to be turned ON and the second control current IB flows along the second current path, thereby slightly increasing the voltage of the second output node NOUT2 connected to the second end of the fourth control transistor CTR4.

When the voltage at the second output node NOUT2 is slightly increased, the voltage at the first node N1 becomes greatly reduced by the reduced resistance generated through the second control transistor CTR2 connected to the second output node NOUT2.

When the voltage at the first node N1 is greatly reduced, the third control transistor CTR3 is turned completely OFF, and the first control current IA flowing along the first current path is combined into the second control current IB flowing along the second current path, and the magnitude of the first control current IA becomes approximately 0.

When the third control transistor CTR3 is completely turned OFF and the second control current IB is 0, the voltage at the second output node NOUT2 is greatly increased. Then, the pull-down transistor PDTR is turned ON, thus causing the output current IOUT to be conducted (sinked) to the ground VSS. In this case, a sinking current is generated. If a capacitor (load, not shown) is installed outside the third output node NOUT3, the capacitor is discharged.

The amplifier 100 may further include capacitors C1 and C2 connected in series between the fourth and fifth output nodes NOUT4 and NOUT5. The capacitors C1 and C2 control the AC characteristics of the amplifier 100.

The operation of the amplifier 100 when the magnitude of the second bias current IF2 is controlled to be smaller than that of the first bias current IF1 is described for convenience. However, the present invention is not limited to this description, and in other embodiments, the magnitude of the second bias current IF2 may be controlled to be larger than that of the first bias current IF1.

If the first and second control voltages VCTRL1 and VCTRL2 are controlled to make the magnitude of the second bias current IF2 be larger than that of the first bias current IF1, the amplifier 100 will operate in an opposite way to that described above. However, the working principle of the amplifier 100 is the same.

As described above, in an amplifier according to the present invention, the magnitudes of quiescent current and output current can be easily controlled, and the amplifier can operate stably regardless of external manufacturing process changes since there are a few circuit parameter variations.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An amplifier comprising:
   an input circuit configured to convert a voltage difference between input signals into a current;
   an output circuit configured to output an output current to the outside of the amplifier;
   a first control circuit generating a first control current; and
   a second control circuit generating a second control current;
   wherein the first and second control circuits control the magnitude of a quiescent current that flows through the output circuit in a first operating mode, and controls the magnitude of the output current in a second operating mode, and
   wherein the first control circuit together with the output circuit forms a current mirror, and the first control circuit controls the magnitude of the quiescent current through the output circuit in proportion to the magnitude of a first bias current through the first control circuit.

2. The amplifier of claim 1, wherein the input circuit includes a folded-cascode operational transconductance amplifier.

3. The amplifier of claim 1, wherein the first operating mode is a static state where the voltages of the input signals are equal to each other and the quiescent current flows through the output circuit.

4. The amplifier of claim 1, wherein the second operating mode is an amplifying mode where the voltages of the input signals are different from each other and the output current is sourced by or sinked into the output circuit.

5. The amplifier of claim 1, wherein first and second control voltages are applied from outside of the amplifier, and:
a first bias current is generated in the first control circuit when the first control voltage is applied, controlling the amount of a first control current in the first control circuit;
a second bias current is generated in the second control circuit when the second control voltage is applied, controlling the amount of a second control current in the second control circuit; and
the magnitude of the first bias current is determined by the first control voltage, and the magnitude of the second bias current is determined by the second control voltage.

6. The amplifier of claim 1, wherein the input circuit controls voltages at a first output node and a second output node by converting a voltage difference between input signals into a current; and the output circuit comprises:
a pull-up transistor having a first end to which a power supply voltage is applied, a gate connected to the first output node, and a second end connected to a third output node; and
a pull-down transistor having a first end connected to the third output node, a gate connected to the second output node, and a second end to which a ground voltage is applied.

7. An amplifier comprising:
an input circuit configured to convert a voltage difference between input signals into a current;
an output circuit configured to output an output current to the outside of the amplifier;
a first control circuit generating a first control current; and
a second control circuit generating a second control current;
wherein the first and second control circuits control the magnitude of a quiescent current that flows through the output circuit in a first operating mode, and controls the magnitude of the output current in a second operating mode,
wherein the first control circuit comprises:
a first control transistor having a first end connected to the power supply voltage, a gate to which the first control voltage is applied, and a second end connected to a first node;
a second control transistor having a first end connected to the first node, a gate connected to the second output node, and a second end connected to the ground voltage; and
a third control transistor having a first end connected to the first output node, a second end connected to the second output node, and a gate connected to the first node,
wherein the first bias current flows through the first control transistor and through the second control transistor, and the first control current flows through the third control transistor.

8. The amplifier of claim 7, wherein the third control transistor is an NFET transistor.

9. An amplifier of comprising:
an input circuit configured to convert a voltage difference between input signals into a current;
an output circuit configured to output an output current to the outside of the amplifier;
a first control circuit generating a first control current; and
a second control circuit generating a second control current;
wherein the first and second control circuits control the magnitude of a quiescent current that flows through the output circuit in a first operating mode, and controls the magnitude of the output current in a second operating mode,
wherein the second control circuit comprises:
a sixth control transistor having a first end connected to the power supply voltage, a gate connected to the first output node, and the second end connected to the second node;
a fifth control transistor having a first end connected to the second node, a gate connected to the second control voltage, and a second end connected to the ground voltage; and
a fourth control transistor having a first end connected to the first output node, a second end connected to the second output node, and a gate connected to the second node,
wherein the second bias current flows through the sixth control transistor and through the fifth control transistor, and the second control current flows through the fourth control transistor.

10. The amplifier of claim 9, wherein the fourth control transistor is a PFET transistor.

11. The amplifier of claim 1, wherein the magnitude of the first bias current is smaller than the magnitude of the second bias current.

12. An analog amplifier comprising:
a folded-cascode operational transconductance amplifier configured to control voltages at a first output node and at a second output node by converting a voltage difference between input signals into a current;
an output circuit configured to output an output current to a load outside of the analog amplifier in response to a change in the voltages at the first and second output nodes;
a first control circuit forming a first current path between the first and second output nodes, and controlling the magnitude of current flowing along the first current path when a first control voltage is applied; and
a second control circuit forming a second current path between the first and second output nodes, and controlling the magnitude of current flowing along the second current path when a second control voltage is applied,
wherein the first and second control circuits control the magnitude of a quiescent current that flows through the output circuit in a first operating mode and control the magnitude of the output current by adjusting the magnitudes of currents flowing along the first and second current paths in a second operating mode, and
wherein the control circuit together with the ouput circuit forms a current mirror, and the magnitude of the quiescent current is proportional to the magnitude of a first bias current in the first control circuit generated in response to application of a first control voltage.

13. The analog amplifier of claim 12, wherein the first operating mode is a static state where the voltages of the input signals are equal to each other and the quiescent current flows through the output circuit.

14. The analog amplifier of claim 12, wherein the second operating mode includes an amplifying state where the voltages of the input signals are different from each other and the output current is sourced by or sinked into the output circuit.

15. The analog amplifier of claim 12, wherein the first and second control voltages are DC voltages which are applied from the outside of the analog amplifier.

16. The analog amplifier of claim 12, wherein the output circuit comprises:
a pull-up transistor having a first end connected to a power supply voltage, a gate connected to the first output node, and a second end connected to a third output node; and
a pull-down transistor having a first end connected to the third output node, a gate connected to the second output node, and a second end connected to a ground voltage.

17. An amplifier comprising:
a folded-cascode operational transconductance amplifier configured to control voltages at a first output node and at a second output node converting a voltage difference between input signals into a current;
an output circuit configured to output current to a load outside of the analog amplifier in response to change in the voltages at the first and second output nodes;
a first control circuit forming a first current path between the first and second output nodes, and controlling the magnitude of current flowing along the first current path when a first control voltage is applied; and
a second control circuit forming a second current path between the first and second output nodes, and controlling the magnitude of current flowing along the second current path when a second control voltage is applied,
wherein the first and second control circuits control the magnitude of a quiescent current that flows through the output circuit in a first operating mode, and control the magnitude of the output current by adjusting the magnitudes of current flowing along the first and second current paths in a second operating mode,
wherein the first control circuit comprises:
a first control transistor having a first end connected to the power supply voltage, a gate connected to the first control voltage, and a second end connected to the first node;
a second control transistor having a first end connected to the first node, a gate connected to the second output node, and a second end connected to the ground voltage; and
the first current path including a third control transistor which has a first end connected to the first output node and a second end connected to the second output node and controls the magnitude of current flowing along the first current path in response to a voltage level at the first node,
wherein a first bias current flows from the first control transistor to the second control transistor.

18. The amplifier of claim 17, wherein the third control transistor is an NFET transistor.

19. An amplifier comprising:
a folded-cascode operational transconductance amplifier configured to control voltages at a first output node and at a second output node by converting a voltage difference between input signals into a current;
an output circuit configured to output an output current to a load outside of the analog amplifier in response to a change in the voltages at the first and second output nodes;
a first control circuit forming a first current path between the first and second output nodes, and controlling the magnitude of current flowing along the first current path when a first control voltage is applied; and
a second control circuit forming a second current path between the first and second output nodes, and controlling the magnitude of current flowing along the second current path when a second control voltage is applied,
wherein the second control circuit comprises:
a sixth control transistor having a first end connected to the power supply voltage, a gate connected to the first output node, and a second end connected to a second node;
a fifth control transistor having a first end connected to the second node, a gate connected to the second control voltage, and a second end connected to the ground voltage; and
the second current path including a fourth control transistor which has a first end connected to the first output node and a second output node connected to the second output node and controls the magnitude of current flowing along the second current path in response to the voltage at the second node,
wherein a second bias current flows through the sixth control transistor and through the fifth control transistor.

20. The amplifier of claim 19, wherein the fourth control transistor is a PFET transistor.

21. The amplifier of claim 19, wherein the magnitude of the first bias current is smaller than the magnitude of the second bias current.

* * * * *